United States Patent [19]
Hartley et al.

[11] Patent Number: 4,910,700
[45] Date of Patent: Mar. 20, 1990

[54] BIT-SLICED DIGIT-SERIAL MULTIPLIER

[75] Inventors: Richard I. Hartley, Schenectady, N.Y.; Peter F. Corbett, Princeton, N.J.

[73] Assignee: General Electric Company, Schenectady, N.Y.

[21] Appl. No.: 358,277

[22] Filed: May 30, 1989

Related U.S. Application Data

[63] Continuation-in-part of Ser. No. 231,937, Aug. 15, 1988, abandoned.

[51] Int. Cl.$^4$ .............................................. G06F 7/52
[52] U.S. Cl. .................................... 364/754; 364/759
[58] Field of Search ....................... 364/754, 757–760

[56] References Cited

U.S. PATENT DOCUMENTS

| | | | |
|---|---|---|---|
| 3,582,634 | 6/1971 | Bartlett | 364/759 |
| 3,610,907 | 1/1969 | Taylor | 364/759 |
| 4,799,182 | 1/1989 | Marwood | 364/748 |

OTHER PUBLICATIONS

J. P. Hayes, Computer Architecture and Organization, 2nd Ed., ©1988, 1978, McGraw Hill, Inc., pp. 246–248.
J. E. Robertson, "Two's Complement Multiplication in Binary Parallel Digital Computers", IRE Transactions on Electronic Computers, vol. EC-4, Sep. 1955, pp. 118–119.

*Primary Examiner*—Gary V. Harkcom
*Assistant Examiner*—Tan V. Mai
*Attorney, Agent, or Firm*—Allen L. Limberg; James C. Davis, Jr.; Marvin Snyder

[57] ABSTRACT

A digital multiplier for multiplying together W-bit digit-serial multiplier and multiplicand signals includes a combinational array of multiplier cells arranged in N rows and W columns. A digit-serial-in/parallel-out register supplies respective bits of each successive multiplicand signal to the W columns of the array, the N rows of which receive respective bits of each successive digit of the multiplier signal. After each earlier digit of the multiplier is processed, the carry and sum bits are forwarded without column shift and with one column shift, respectively, from the final row to the first row of multiplier cells. This scrolls the operation of the W-column-by-N-row multiplier cell array, allowing it to be used M times for each word of the multiplier signal, one for each of the M digits in a W-bit word of the multiplier signal. The sum bits from the final column of multiplier cells provide the minor product output signal of the digital multiplier in digit-serial format, as each digit of the multiplier signal is processed. In processing the final digit of the multiplier, the carry and sum bits are shifted differentially by one bit place and are conveyed by shift registers to a digit-serial final adder, the full sum output of which supplies the major product output signal of the digital multiplier in digit-serial form. Supplying the minor and major product output signals in parallel permits pipelined operation of the apparatus.

14 Claims, 13 Drawing Sheets

BIT-SLICED DIGIT-SERIAL MULTIPLIER

This is a continuation-in-part of U.S. Pat. application No. 231,937, filed August 15, 1988, and now abandoned.

The invention relates to digital multipliers and, more particularly, to digital multipliers that process digit-serial digital operands to generate a digit-serial product.

BACKGROUND OF THE INVENTION

The understanding of the invention requires an appreciation of what bit-serial and digit-serial signal processing procedures are. In bit-serial computation, data streams arrive at various computational elements a single bit at a time rather than a digital word at a time as in a fully parallel architecture. Bit-serial architectures generate a single bit of output in each fundamental clock cycle. The advantage of bit-serial architecture is that it is very simple to implement and to design and consumes very little die area in integrated-circuit devices. Bit-serial architectures have often been perceived as having a disadvantage not only of a long latency time, but also the disadvantage of a low throughput even after the pipeline delay latency period has elapsed.

The inventors in U.S. patent application Ser. No. 182,602, filed 18 April 1988, entitled "A CELL STACK FOR VARIABLE DIGIT WIDTH SERIAL ARCHITECTURE" and assigned to General Electric Company indicate that optimal results in terms of throughput and die area require an architecture which draws upon both parallel and serial computational philosophies. That is, in general, optimal design requires the utilization of digit-serial architectural circuit designs. In these designs, digits having a plurality N in number of parallel bits are processed in a serial fashion. Thus, in digit-serial architecture, a data word will have a number W of bits that is a multiple M times N so that data word can be divided into an integral number of digits of N-bit width. Initially, N may be chosen to be 2, 3, 4, 5, 6 or more bits, but thereafter the chosen value of N is maintained fixed. Arithmetic data flow within the circuit is over digit-wide signal lines and is propagated with the least significant digit first. Accordingly, data arrives serially at each operator, one digit at a time. Arithmetic and logic operators perform digit-serial calculations on this data and provide digit-serial output. To exploit this architecture fully, it is necessary to accommodate arbitrary digit widths up to some reasonable maximum, $N_{max}$. Typically, $N_{max}$ is 12 or 16, but $N_{max}$ is not limited thereto. However, once an optimal digit width is determined for a particular signal processing system which is to be implemented on one or more integrated circuit chips, the digit width is fixed for circuit components appearing on that chip.

In the design of circuit chips to carry out digit-serial processing, it is desirable to employ combinations of hardware and software generally referred to as "silicon compilers". In general, the role of a silicon compiler is to accept from a human operator specified signal processing functions and to produce from these specifications a plurality of integrated circuit masks. These masks when employed in the proper sequence and in accordance with accepted integrated circuit processing methods, produce an electronic integrated circuit chip implementing the specified signal processing function in a given semiconductor technology and architecture. The architecture of relevance herein is the digit-serial architecture and, more particularly, the realization of a digital multiplier using digit-serial architecture. Silicon compilers exist which permit the human operator to specify the signal processing function in terms of a high level algebraic equation which is received by the silicon compiler and operated on, thereby to produce the mask set which will operate to generate an electronic integrated-circuit chip that implements the specified high-level algebraic function.

To carry out these objectives, it is necessary for silicon compilers to have available to them a library of cells which cells are capable of carrying out operations on data that are as wide as the desired digit size. For it to be feasible for silicon compilers to carry out these objectives, the library of basic cells which is required to implement these digit-serial operations, cannot be too large. Accordingly, an aspect of the invention is directed to a scheme of digital multiplier construction which uses basic cells and stacks bit slices to generate digital multipliers for any digit size. More particularly, an aspect of the invention is directed to augmenting the cell library for a silicon compiler so the compiler can construct digit-serial multipliers for any reasonable digit size specified by the human operator. The basic cells are often refered to as "tiles" and the arrangement of them on an integrated-circuit die is often refered to as "tiling".

An analysis of the digit-serial multiplier to be described in the present specification will reveal it to have features found in combinational array multipliers, known in the prior art. Such combinational array multipliers are described, for example, by J. P. Hayes on pages 246-248 of his book COMPUTER ARCHITECTURE AND ORGANIZATION, 2nd Ed., copyright 1988, 1978 by McGraw Hill, Inc., New York City, St. Louis, etc.

SUMMARY OF THE INVENTION

The object of the invention is to provide a digit-serial multiplier.

The digit-serial multiplier of the invention includes a combinational array of multiplier cells arranged in N rows and W columns. This array is operated similarly to a prior-art combinational array multiplier for multiplying two parallel-bit words together, except in the following regards. A multiplicand register is used which is a digit-serial-in/parallel-out register. The array of multiplier cells, having only N rows, does not provide for multiplication by the entire multiplier word at one time, but only one digit at a time. Secondly, the processing of the carry and sum bits from the final (or $N^{th}$) row of multiplier cells is done differently. After the processing of each earlier digit of the multiplier is completed, the carry and sum bits from the final row of multiplier cells are introduced into the first row of multiplier cells without column shift and with one column shift, respectively, to be used in the processing of the next digit of the multiplier. This novel procedure scrolls the operation of the W columns by N row multiplier cell array, its full N rows M times, allowing the N-row multiplier cell array to operate in effect as a W column by MN row multiplier cell array, where M is the number of digits in the multiplier signal. The sum bits from the final (or $W^{th}$) column of multiplier cells provide the minor product output signal of the digital multiplier in digit-serial format, as each digit of the multiplier signal is processed. In the processing of the final digit of the multiplier, the carry and sum bits are shifted differentially by one bit place and are conveyed by shift register action

DETAILED DESCRIPTION

Figure 1A:
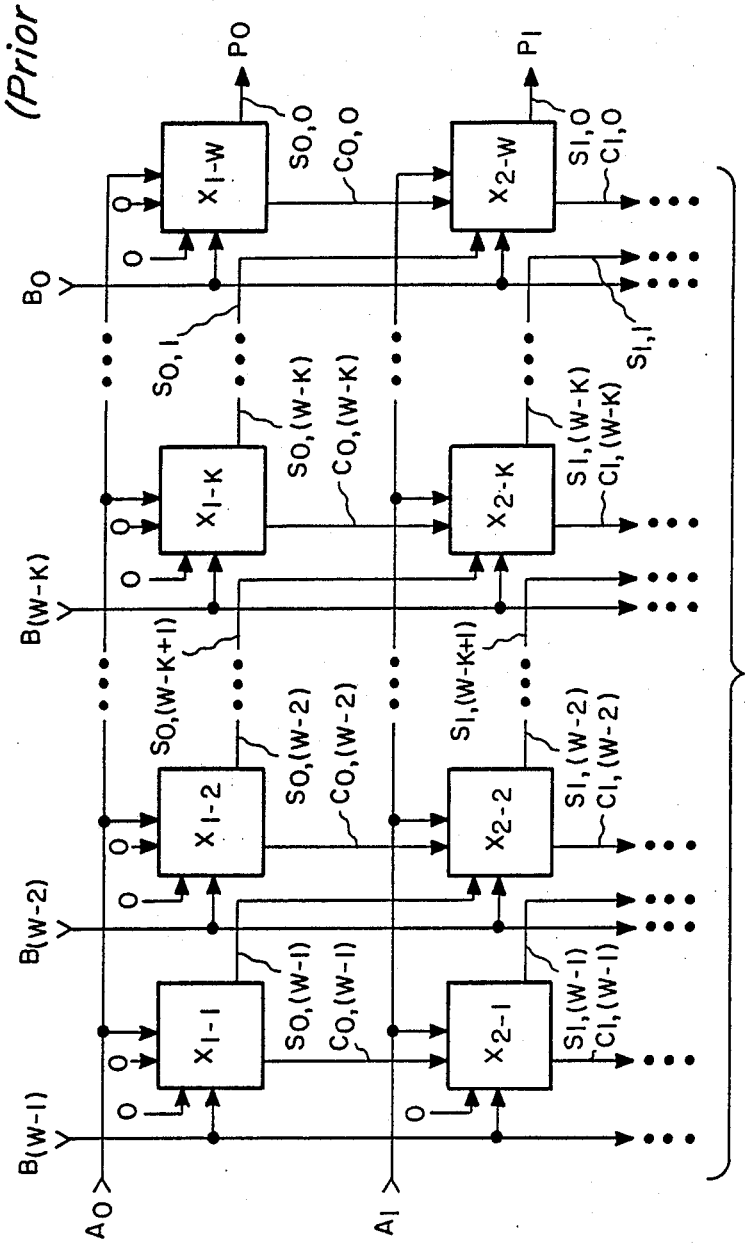
FIGS. 1A and 1B combine to form a FIG. 1 that is a schematic diagram of a prior-art combinational array multiplier.
Figure 1B:
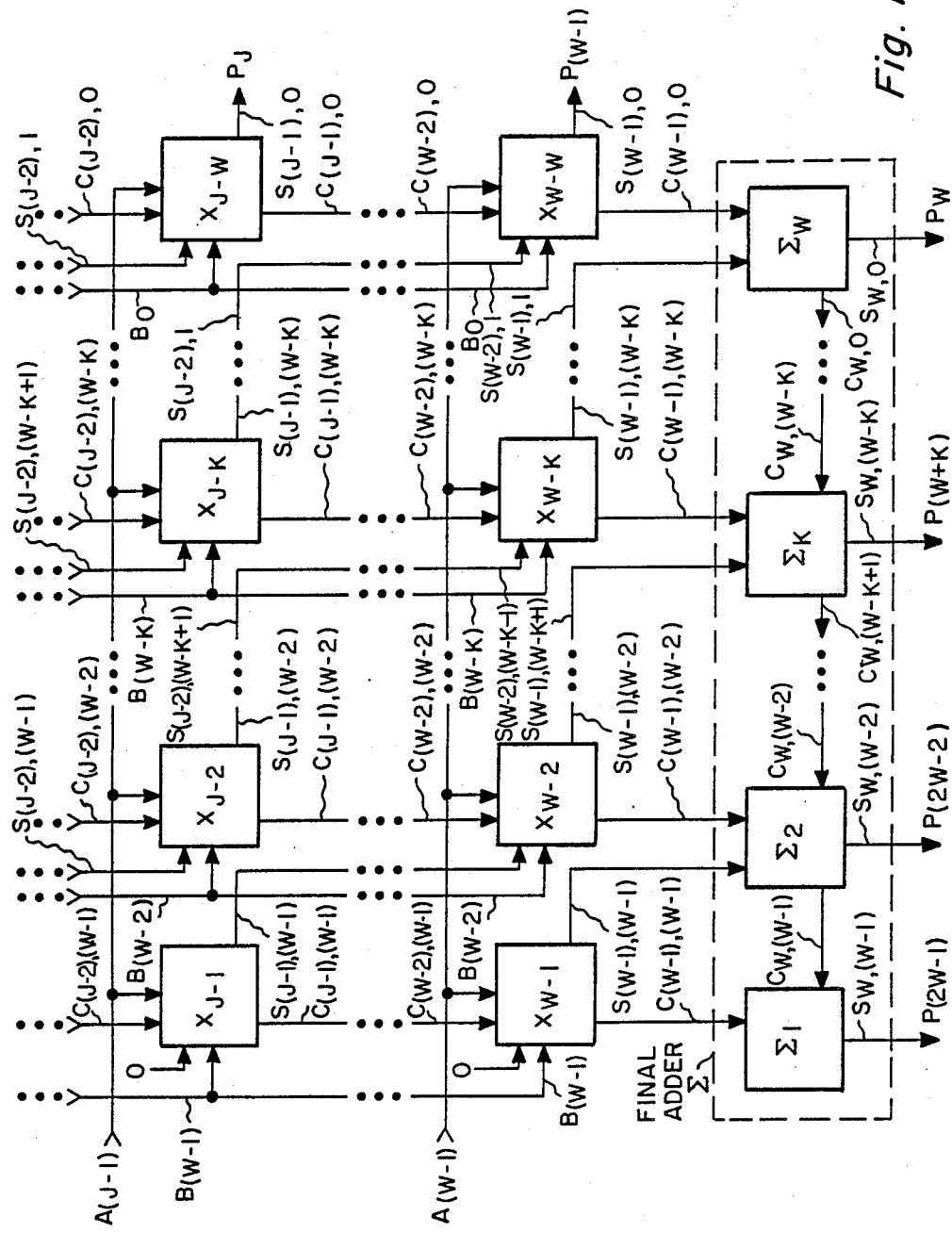

The FIG. 1 prior-art combinational array multiplier comprises an array of multiplier cells, $W^2$ in number, arranged in W rows and W columns, where W is the number of bits in each of a digital multiplicand word and a digital multiplier word. These multiplier cells $X_{1-1}, \ldots X_{W-W}$ have call-outs of X followed by a numerical subscript. This subscript has a first portion (before a hyphen) identifying the number of the row the multiplier cell is located in and has a second portion (after a hyphen) identifying the number of the column the multiplier cell is located in. The rows of the array of multiplier cells are consecutively ordinally numbered first through $W^{th}$, proceeding from top to bottom, and the columns are consecutively ordinally numbered first through $W^{th}$, proceeding from left to right.

Each row of multiplier cells has a respective row bus associated therewith, which row busses receive in parallel respective ones $A_0, A_1, \ldots A_{(J-1)}, \ldots A_{(W-1)}$ of the W bits in the multiplier word. These bits are applied in order of increasing significance from the top row bus to the bottom row bus J is an integer between one and W inclusive and is used here to be representative of the subscripts of A between 2 and W. Each column of multiplier cells has a respective column bus associated therewith, which column busses receive in parallel respective ones $B_{(W-1)}, B_{(W-2)}, \ldots B_{(W-K)}, \ldots B_0$ of the W bits in the multiplicand word. These bits are applied in order of decreasing significance from the left column bus to the right column bus. K is an integer between one and W inclusive and (W-K) is used here to be representative of the subscripts of B between 0 and W-2.

Each multiplier cell has a respective single-bit by single-bit simple multiplier (e.g., an AND gate) included therein for generating a single-bit product, responsive to the bit concurrently supplied that memory cell from its row and column busses. Each multiplier cell as required also has a respective adder included therein for adding to the single-bit product any carry or sum bits received by that multiplier cell from another multiplier cell. Since the single-bit product, the carry bit and the sum bit supplied to the adder together cannot sum to more than 11 in the binary number system, the adder output signal need only have two bits therein, a carry bit and a sum bit of relatively greater and lesser significance respectively. (Multiplier cells in the first row receive no sum or carry signals, and these adders may be omitted. Multiplier cells in the first column receive no sum signals so their adders need have no more than two input ports for respective addends.) Each multiplier cell supplies from respective first and second output ports of its adder a respective carry bit and a respective sum bit of its output signal or, where the multiplier cell has no adder, a zero-valued carry bit is supplied together with the single-bit product as a sum bit. In FIG. 1 these carry bits are denominated C followed by a numerical subscript, and these sum bits are denominated S followed by a numerical subscript.

Except for multiplier cells in the last row, each multiplier cell forwards the carry bit of its output signal to the adder in the multiplier cell in the following row and in the same column of the array. Multiplier cells $X_{W-1}, \ldots X_{W-W}$ in the last row of the array forward the carry bits of their output signals as addends to respective adder stages $\Sigma_1, \ldots \Sigma_W$ of a final adder. The sum bits of the output signals from the last (or $W^{th}$) column of multiplier cells provide the minor product $P_{(W-1)}, \ldots P_J, \ldots P_1, P_0$ portion of the digital product signal from the FIG. 1 combinational array multiplier. The sum bits of the output signals from the last (or $W^{th}$) row of multiplier cells, excepting $X_{W-W}$, are shifted one binary place towards lesser significance and applied as addends to respective ones of the adders $\Sigma_2, \ldots \Sigma_W$. Each of the remaining memory cells (those without W alone as a first or second bit of their numerical subscript) forwards the sum portion of its output signal as an addend to the adder of the multiplier cell in the following row and in the following column.

The carry bits $C_{W,(W-1)}, C_{W,(W-2)}, \ldots C_{W,(W-K)}, C_{W,(W-K-1)}, \ldots C_{W,0}$ of the output signals from adders $\Sigma_2$ through $\Sigma_W$ are supplied as respective addends to the adders $\Sigma_1$ through $\Sigma_{(W-1)}$. The sum bits $S_{W,(W-1)}, S_{W,(W-2)}, \ldots S_{W,(W-K)}, \ldots S_{W,0}$ of the output signals from adders $\Sigma_1$ through $\Sigma_W$ provide the major product $P_{2W-1}, P_{2W-2}, \ldots P_{W+K}, \ldots P_W$ portion of the digital product signal from the FIG. 1 combinational array multiplier.

The operation of the FIG. 1 combinational array multiplier as thusfar described is with regard to unsigned numbers. J. E. Robertson in correspondence entitled "Two's Complement Multiplication in Binary Parallel Digital Computers" appearing on pages 118-119 of the September 1955 IRE TRANSACTIONS ON ELECTRONIC COMPUTERS, Vol.

EC-4, suggests a way of modifying the FIG. 1 combinational array multiplier to adapt it for multiplying signed numbers is two's complement form. When the multiplier signal bit is negative (i.e. $A_{(W-1)}=1$ the partial product generated by the single-bit multipliers in the final (or $W^{th}$) row of multiplier cells $X_{1-W}, \ldots X_{W-W}$ is subtracted, rather than added, when computing the full product. When the multiplier sign bit is positive ($A_{(W-1)}=0$), the partial product is zero-valued, so it is immaterial whether the partial product is added or substracted in computing the full product. One can therefore arrange for subtraction of this partial product term as long as signed multiplications are to be done. As Robertson suggests, this can be done by one's complementing the multiplicand before doing single-W multiplications by $A_{(W-1)}$ sign bit, then adding a ONE in the least significant bit place of this partial product.

Figure 2A:
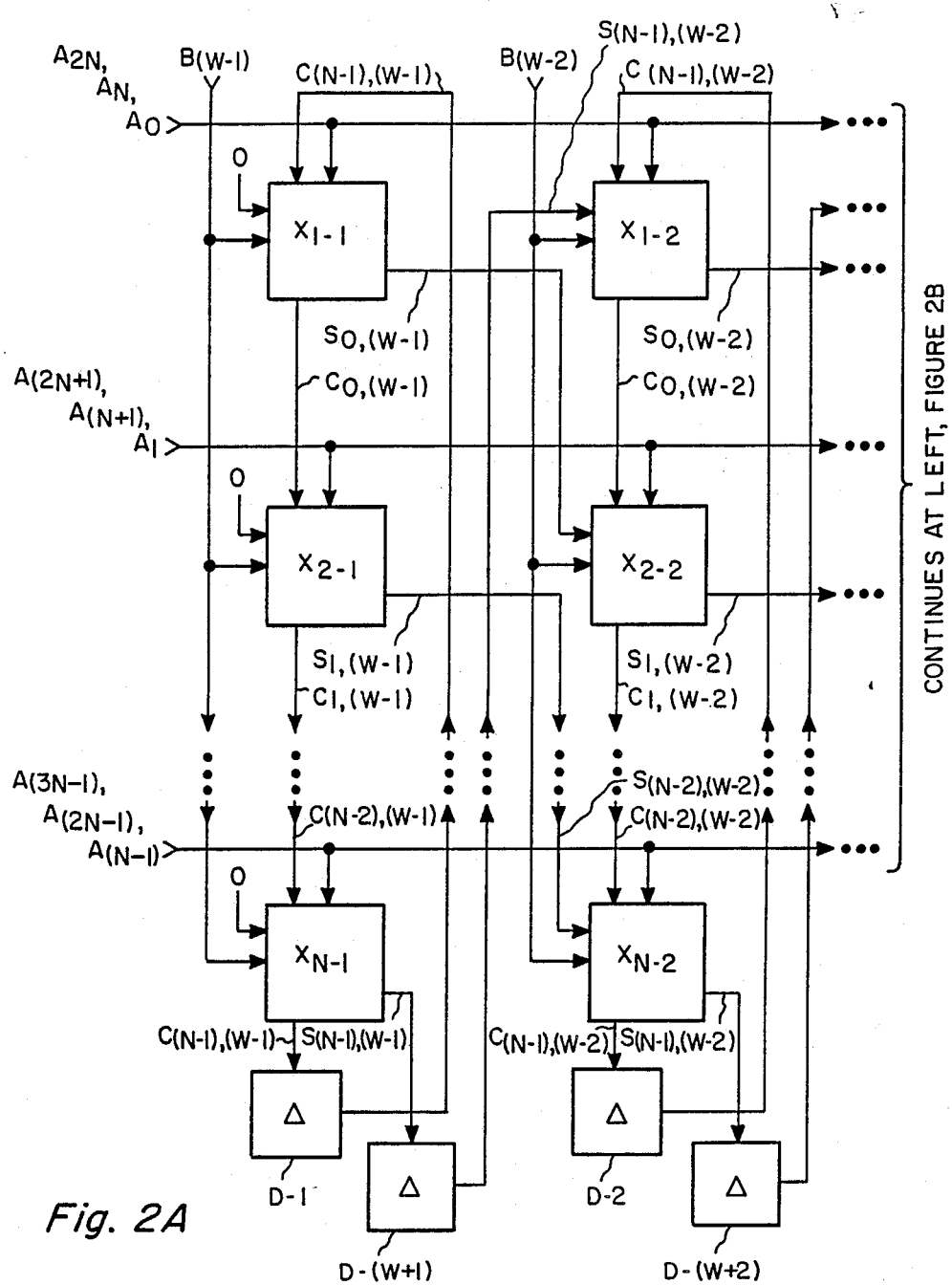
FIGS. 2A and 2B combine to form a FIG. 2 that is a schematic diagram of how a digit-serial multiplier embodying the invention is configured during the processing of each digit of the multiplier signal to generate the minor product in digit-serial format.
Figure 2B:
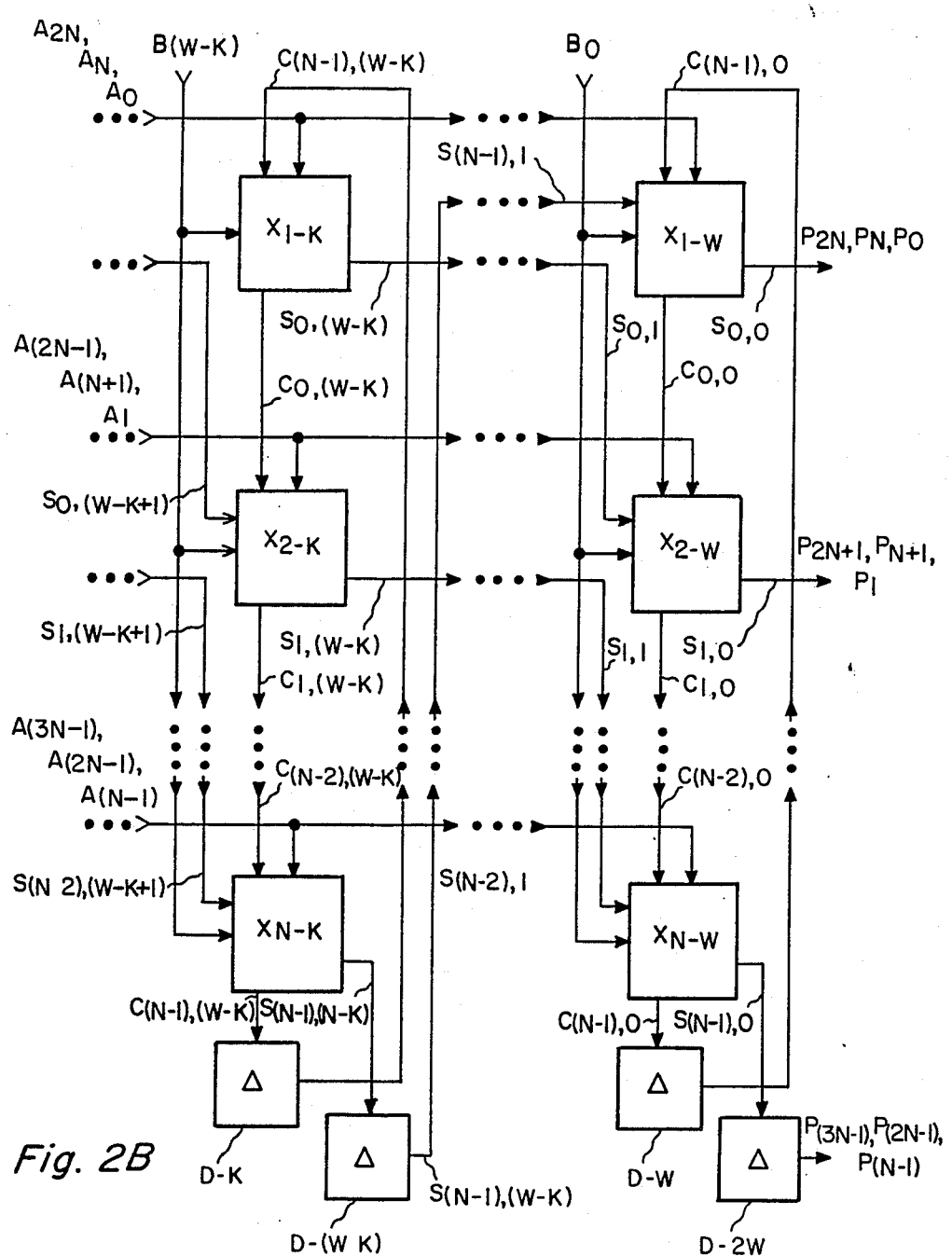

FIG. 2 shows the configuration of the multiplier cells in a digit-serial multiplier embodying the invention, as it appears during the generation of: (1) digit-serial minor product terms at the sum bit output ports of the multiplier cells in the last (or $W^{th}$) column of the array, (2) a sum word at the sum bit output ports of the multiplier cells in the last or ($N^{th}$) row of the array except for multiplier cell $X_{N-W}$, and (3) a carry word at the carry portion output ports of the multiplier cells in the last (or $N^{th}$) row of the array. The array of multiplier cells is still W multiplicand bit slices wide, and $B_{(W-1)}, B_{(W-2)}, \ldots B_0$ bits of the multiplicand are still applied in parallel to the column busses. (These bits of the multiplicand can be supplied from the respective stages of a digit-serial-in/parallel-out register, not shown in FIG. 2), loaded during a first series of clock commands.

The array of multiplier cells has only N rows therein, one for each bit per digit of the digit-serial multiplier, rather than W=MN rows, one for each bit in the multiplier word. During a first clock interval in a second series of clock intervals following the establishment of the multiplicand bit values on the column busses, the row busses receive the digit comprising the least significant bits $A_0, A_1, \ldots A_{(N-1)}$ of the multiplier. On the succeeding clock interval the row busses receive the digit comprising the next least significant bit $A_N, A_{(N-1)}, \ldots A_{(2N-1)}$ of the multiplier, and so forth until the last digit comprising the most significant bits $A_{(M-1)N}, A_{[(M-1)N+1]}, \ldots A_{(MN-1)}$ of the multiplier is received in the $M^{th}$ clock interval of the second series of clock intervals.

The N row array of multiplier cells in FIG. 2 is scrolled a full N rows in its operation between each set of adjoining clock intervals in the second series of clock intervals. There is an N-binary-place shift associated with each successive digit of the multiplier, so the carry and sum bits of partial sums are shifted on a modulo-N basis. That is, the carry bits of the partial sum from the $N^{th}$ (or last) row of multiplier cells appearing on one clock cycle are latched during each clock interval in clocked latches $D_1, \ldots D_W$, respectively, to be supplied during the next clock interval as addends to the adders in the multiplier cells in the first row of the array and in corresponding columns. The sum bits of these partial sums are latched during each clock interval in clocked latches $D_{W+1}, \ldots D_{2W}$, respectively, to be supplied during the next clock interval as addends to the adders in the multiplier cells in the first row of the array, but with a one column shift towards less significance. The sum bits from the last (or $W^{th}$) column of multiplier cells furnish the minor product automatically in digit-serial format.

Figure 3:
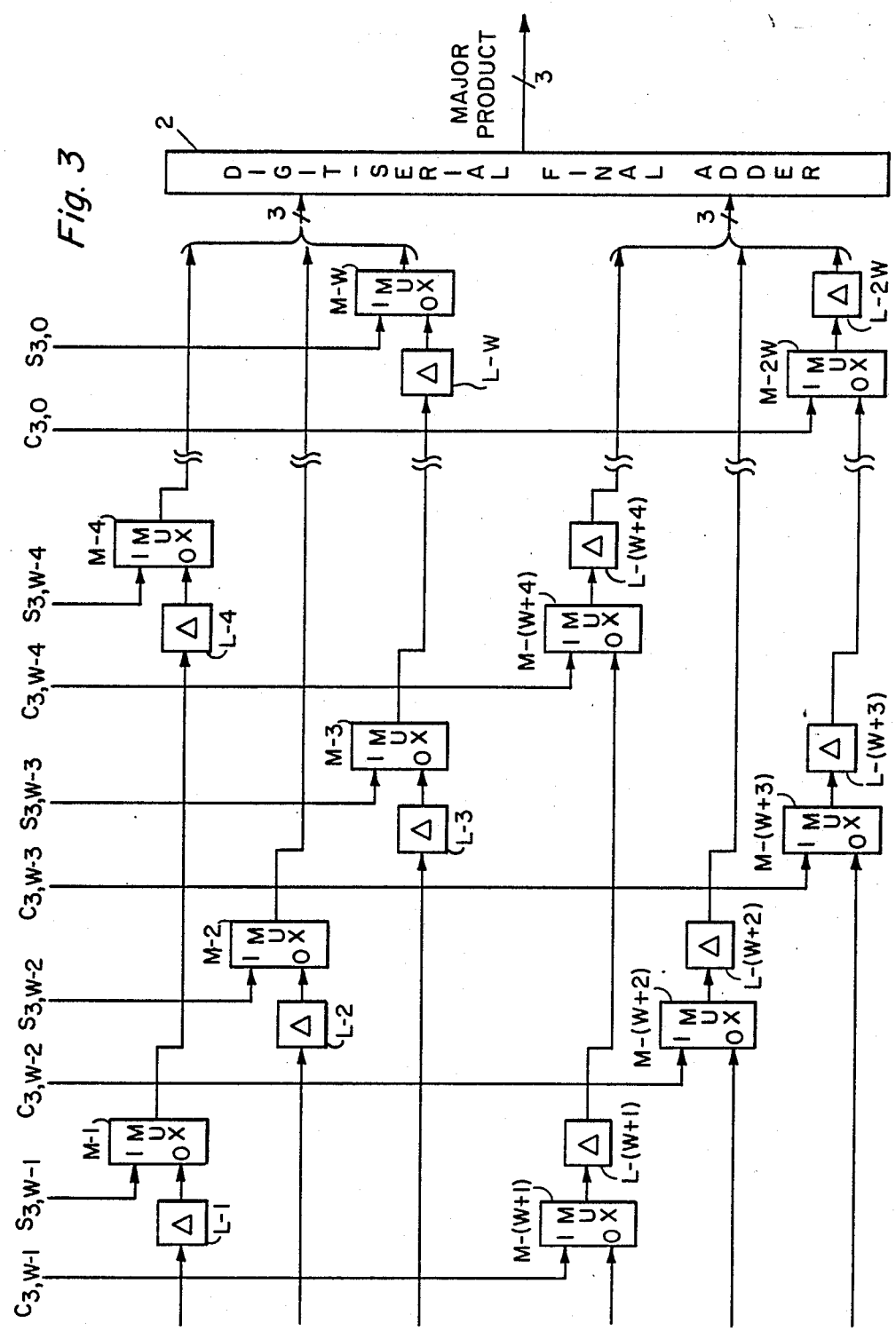
FIG. 3 is a schematic diagram of digit-serial shift registers used to generate the major product of a digital-serial multiplier embodying the invention.

FIG. 3 apparatus is used for generating the major product in a digit-serial multiplier receiving a multiplier operand having digits three bits wide; i.e., N equals three. The FIG. 3 apparatus essentially comprises a digit-serial adder 2 at far right of the figure and two parallel-in/digit-serial-out shift registers respectively located in the top half and in the bottom half of the rest of the figure. The upper shift register processes the sum bits from the last ($N^{th}$) row of multiplier cells in the FIG. 2 array; and the lower shift register processes the carry bits from this last ($N^{th}$) row of multiplier cells.

Each shift register includes three pipeline structures, one for each of the three bits per digit in the digit-serial signals associated with adder 2. (A pipeline structure is a cascade of digital processing circuits that perform successive digital operations on a continuing basis, with input data being received by the earliest digital processing circuit of the cascade at the same time digital operations are still being carried on in the later digital processing circuits of the cascade.) In the upper digit-serial shift register the first pipeline is through a latch L-1, a multiplexer M-1, a latch L-4, a multiplexer M-4, etc. The second pipeline is through a latch L-2, a multiplexer M-2, etc. The third pipeline is through a latch L-3, a multiplexer M-3, . . . a latch L-W and a multiplexer M-W. In the lower digit-serial register the first pipeline is through a multiplexer M-(W+1), a latch L-(W+1), a multiplexer M-(W+4), a latch L-(W+4), etc. The second pipeline is through a multiplexer M-(W+2), a latch L-(W+2), etc. The third pipeline is through a multiplexer M-(W+3), a latch L-(W+3) . . . a multiplexer M-2W, and a latch L-2W. Latches L-1, . . . L-2W are clocked latches, each providing a unit clock interval delay during shift operation. The latches are located so the sum and carry bits reach the adder 2 differentially delayed by a unit clock interval.

During the clock interval when the last digit of the multiplier is supplied to the rows of the n-by-W array of multiplier cells, the application of sum and carry bits from the last row of multiplier cells to the first row of multiplier cells is discontinued. Multiplexers M-1, . . . M-2W in the FIG. 3 apparatus receive a control signal during this clock interval causing them to select the signals for application to their output ports from the signals received at their "ONE" input port respectively. This arranges for the parallel loading of the parallel-in/digit-serial-out registers at this time. In successive clock intervals after the clock interval in which parallel loading of the registers is done, the clocking of unit-clock-interval-delay latches S-1, . . . S-2W shifts the carry and sum bits in digit serial form to the adder 2, the digit-serial sum signal from which is the major product of the digit-serial digital multiplier.

Adder 2 receives the sign bit of the digit-serial multiplier as a carry to complete the subtraction process that includes the one's complementing of the multiplicand in forming its partial product with $A_W$. This procedure will be described in further detail when describing FIG. 7 later on in this specification.

What is of particular interest with regard to how well the shift registers first described can be laid out in an integrated circuit design using a silicon compiler is how the tiling has to proceed, considering the circuitry on the basis of bit-slicing of the multiplicand. If the shift registers were laid out per FIG. 3, three different types of circuit configurations would have to be reduced to component tiles: one for bit slices numbered zero in modulo three terms, one for bit slices numbered unity in modulo three terms, and one for bit slices numbered two in modulo three terms.

More generally, N different types of circuit configurations are required for a digit N bit wide. The same scheme of providing one pipeline per bit in the digit-serial input signal to the output digital-serial adder is used no matter the value of N. Particularly as N is made larger, the number of different circuit configurations required for different bit slices of the multiplicand becomes excessive.

Figure 4:
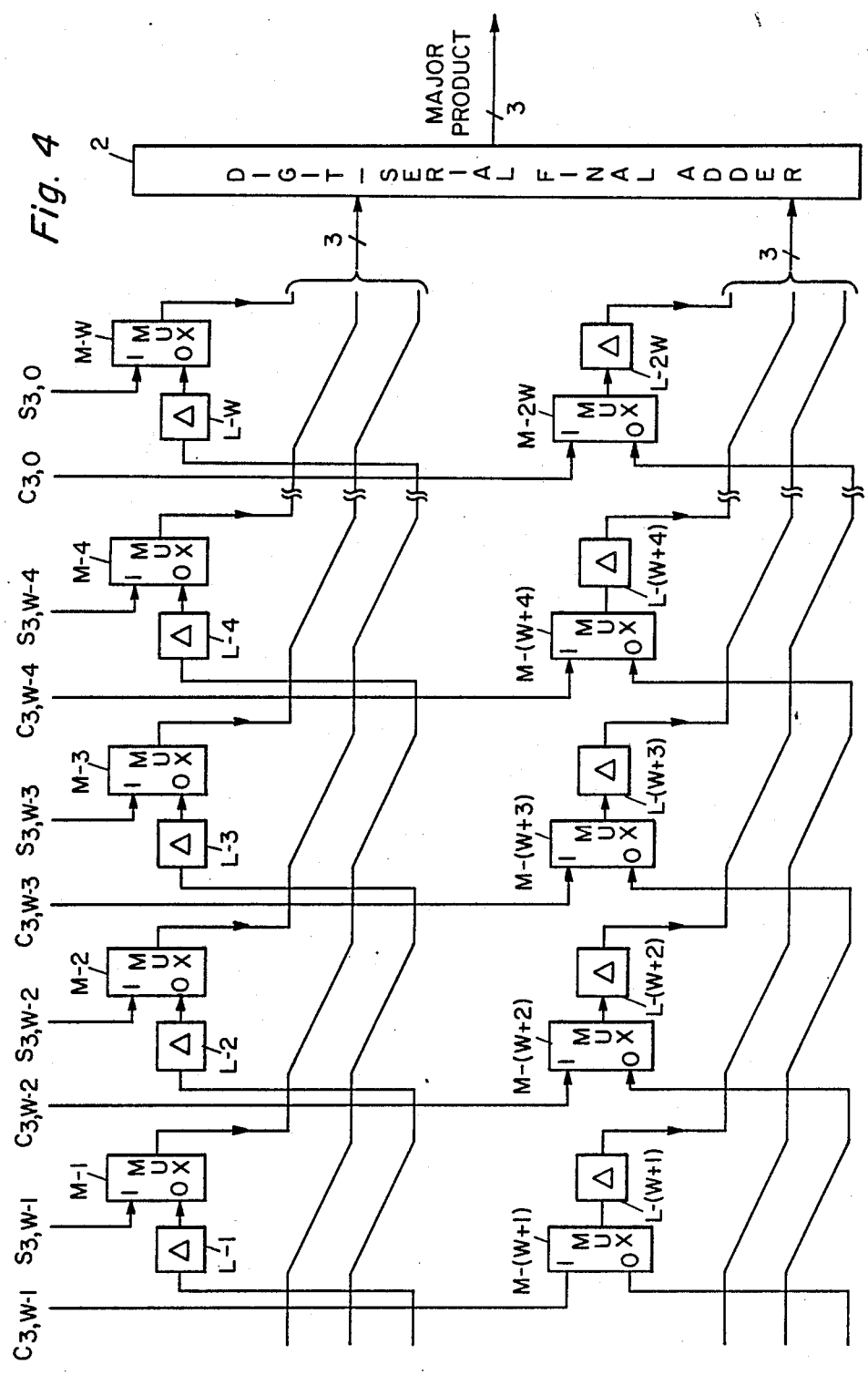
FIG. 4 is a schematic diagram similar to that of FIG. 3, but rearranged to indicate how tiling of the major product sum and carry shift registers, stage by stage, can be implemented.

FIG. 4 illustrates how by cyclically rotating connections through the pipelines in such a digit-serial shift register, or "braiding" the pipelines, the same circuit configuration can be used for each bit slice. In FIG. 4 the pipeline braiding connections are shown located more remotely from the array of multiplier cells than the other elements of the digit-serial shift registers are. But, alternatively, as shall be shown in FIGS. 6A and 6B (or in FIGS. 6A and 9), the braiding connections may instead be between the array of multiplier cells and the other elements of the digit-serial shift registers.

Figure 5:
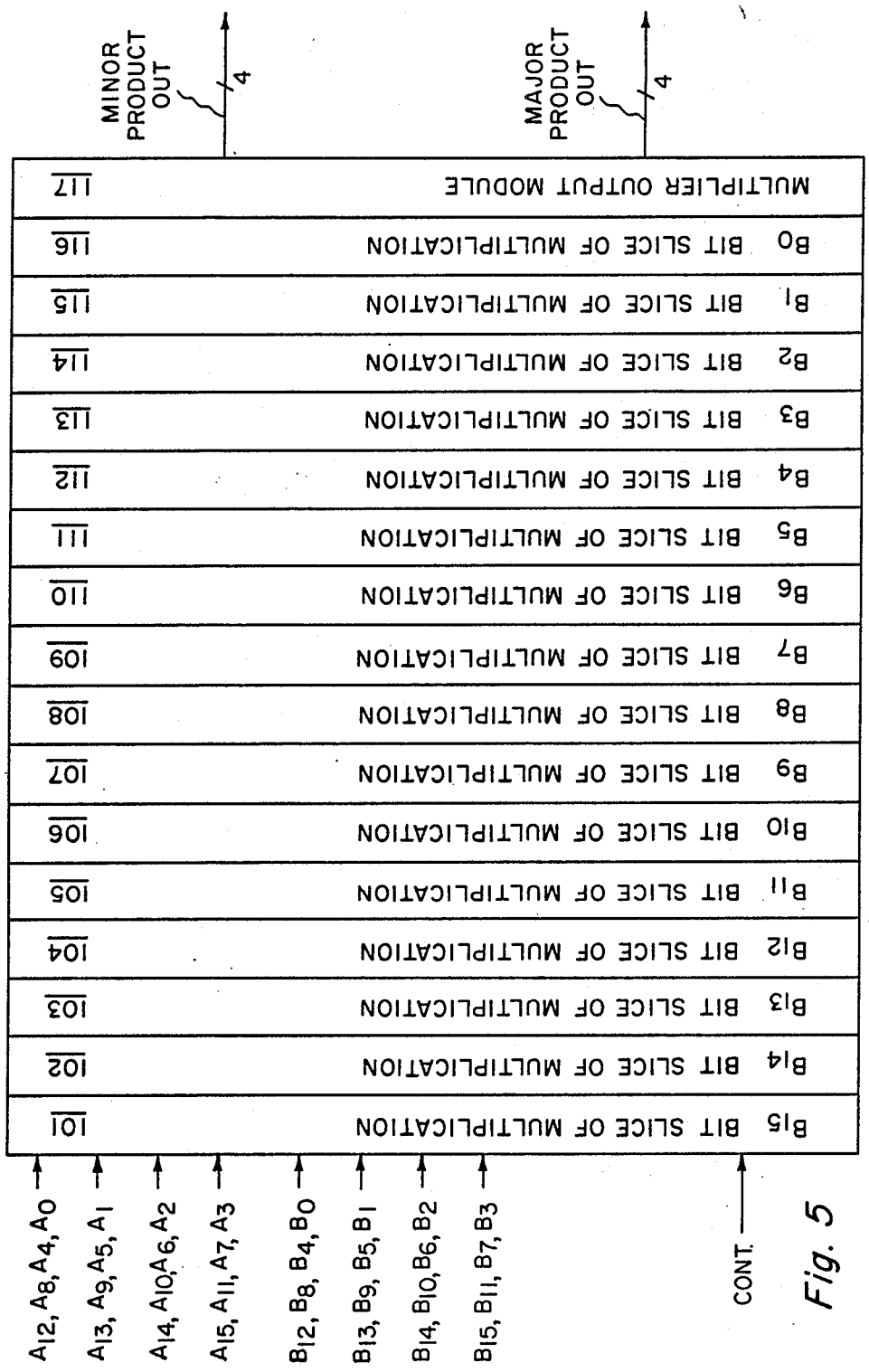
FIG. 5 is a diagram of the general layout on an integrated-circuit die of a digit-serial multiplier embodying the invention which repetitively uses basic cells.

FIG. 5 shows the general architecture for a large-scale-integrated circuit 16×16 digit-serial digital multiplier where the digits are four bits wide. The FIG. 5 digital multiplier comprises respective modules 101–116 for processing each bit slice of the multiplicand. These multiplicand-bit-slice modules 101–116 can each be constructed using a set of simpler building blocks or "tiles" that are a part of the library of basic circuit configurations stored and arranged into more complex circuit configurations by a silicon compiler. The nature of these tiles and their arrangement to form one of the structurally similar modules 101–116 will be treated in more detail in connection with FIGS. 6A and 6B (or in FIGS. 6A and 9). The FIG. 5 digital multiplier also includes a multiplier output module 117. A portion of this module is the final digit-serial adder for digit-serial sum and carry words, which adder generates the major product output signal.

Figure 6A:
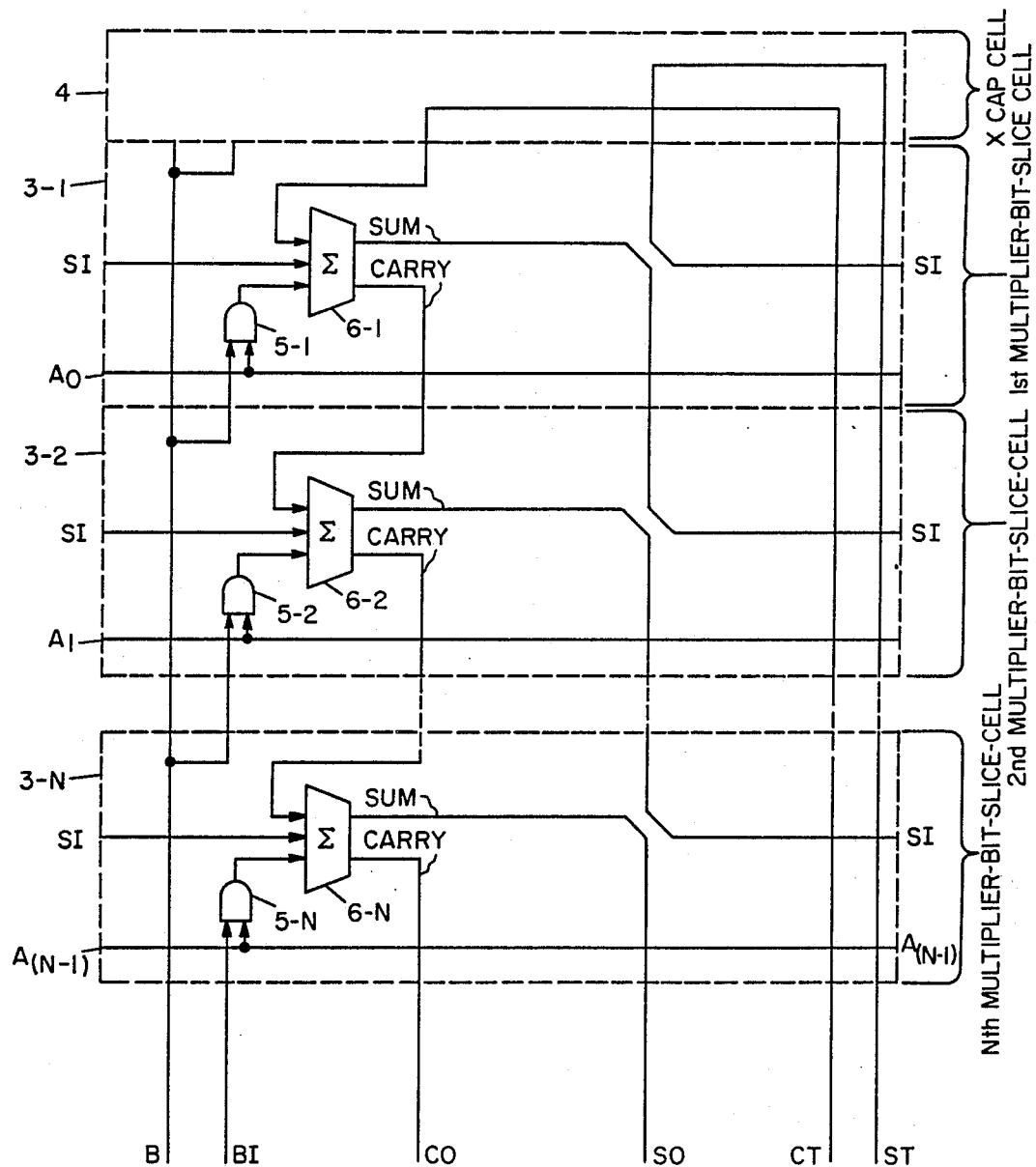
FIGS. 6A and 6B combine to form a FIG. 6 that is a schematic diagram of one bit-slice of the FIG. 5 digit-serial multiplier, bit-slicing being done on the multiplicand.
Figure 6B:
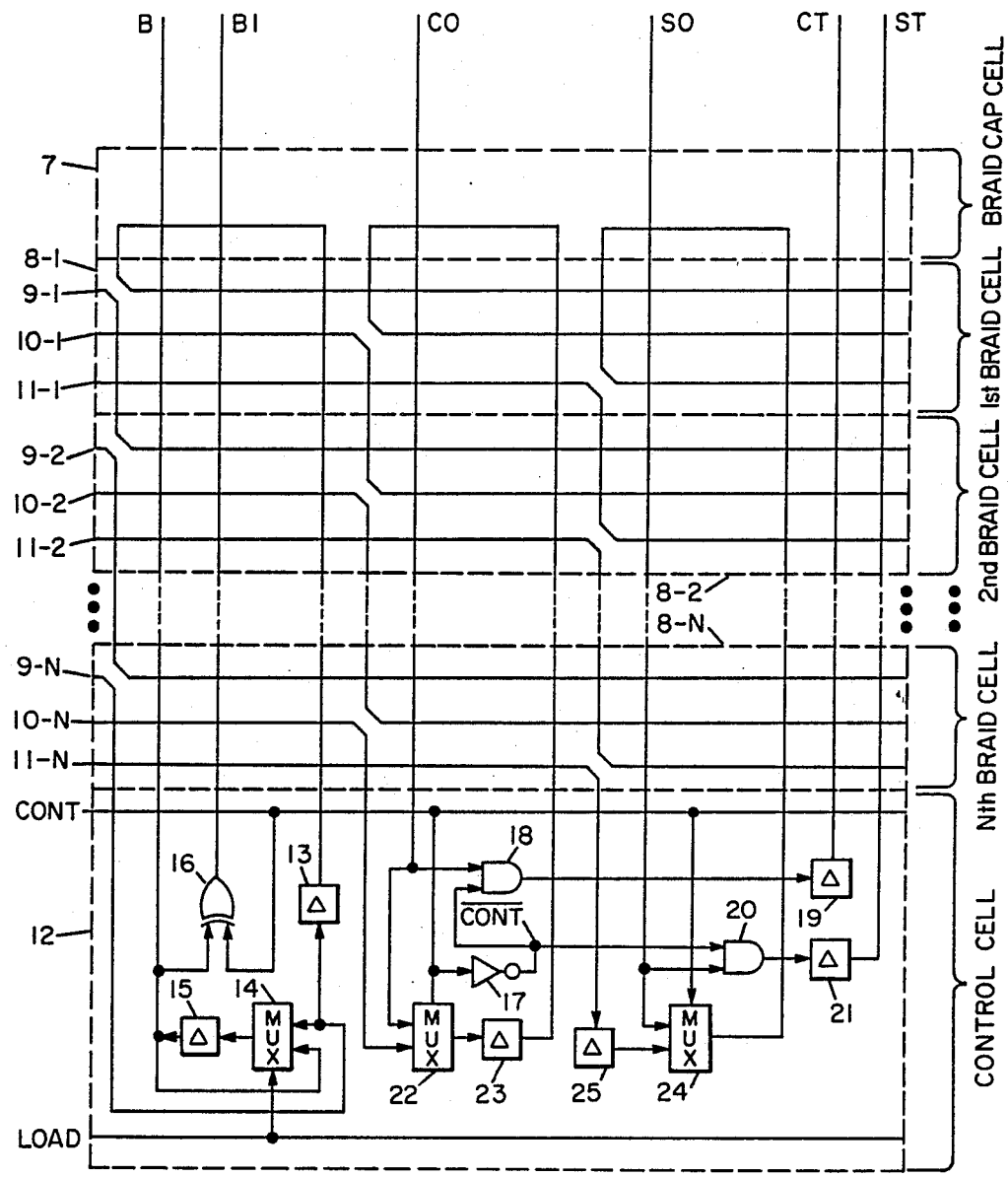

FIGS. 6A and 6B show respective parts of a multiplicand-bit-slice module such as 101–116 of FIG. 5. The dashed-line boxes in FIGS. 6A and 6B indicate tile boundaries, and the bottommost tile boundary in FIG. 6A is to be abutted with the FIG. 6B topmost tile boundary. The multiplicand-bit-slice module shown in FIGS. 6A and 6B will in practice have positive and negative operating voltage busses running from top to bottom, usually with one of them along the left edge of the bit-slice module and with the other of them along the right edge of the bit-slice module. These operating voltage busses are omitted from FIGS. 6A and 6B for simplicity of illustration. So are clock busses.

To implement the rectangular array of multiplier cells each multiplicand-bit-slice module includes N multiplier-bit-slice cells 3-1, . . . 3-N as shown in FIG. 6A, all similar in structure and layout on the integrated circuit. The multiplier-bit-slice cell is a basic tile used by the silicon compiler. A multiplier cap cell 4, another basic tile, is shown in FIG. 6A. Multiplier cap cell 4 is used at the topmost end of the multiplicand-bit-slice module to complete the routing of the array from the multiplier-bit-slice cell, 3-N to the multiplier-bit-slice cell 3-1. The multiplier cap cell 4 also completes the routing of the sum from the bottommost of the multiplier-bit-slice cells in the multiplicand-bit-slice module of FIGS. 6A and 6B to the topmost of the multiplier-bit-slice cells in the adjoining multiplicand-bit-slice module to the right. The multiplier-bit-slice cells 3-1, . . . 3-N are arranged in order of their numbering below the multiplier cap cell 4.

Each of the multiplier-bit-slice cells 3-1, 3-N includes a respective one of AND gates 5-1, . . . 5-N used to generate a single-bit product and a respective one of adders 6-1, . . . 6-N used to combine the single-bit product with sum and carry bits of the output signals from other multiplier-bit-slice cells. Row busses with respective ones of the bits $A_0, \ldots A_{(N-1)}$ of the N-bit-wide multiplier digit applied to them cross the bottom portions of multiplier-bit-slice cells 3-1, . . . 3-N and have connections to the multiplier input ports of AND gates 5-1, . . . 5-N respectively. These row busses extend horizontally across all the multiplicand-bit-slice modules.

A vertically disposed column bus B at the extreme left of the multiplicand-bit-slice module supplies the bit B(W-K) of the multiplicand to the multiplicand input port of AND gates 5-1, . . . 5-(N-1). The multiplicand input port of AND gate 5-N receives either B(W-K), or its complement on a BI bus that extends upward only into multiplier-bit-slice cell 6-N. B(W-K) is received during all digits of a digit-serial multiplier word except the last digit, assuming two's complement arithmetic is used, and the complement of B(W-K) is received during the last digit.

The sum bit from each of the adders 6-1, . . . 6-(N-1) is directed downward into the multiplier-bit-slice cell below and then to the right to be applied at the SI input of the multiplier-bit-slice cell below and to the right. The carry bit from each of the adders 6-1, . . . 6-(N-1) is directed downward into the multiplier cell below and applied to its adder as an addend.

FIG. 6B shows the tiles below the tile that provides the $N^{th}$ multiplier-bit-slice cell 3-N in the multiplicand-bit-slice module. The uppermost of these tiles, a braid cap cell 7, caps a stack of tiles similar to each other, the braid cells 8-1, . . . 8-N. The braid cells 8-1, . . . 8-N receive bits of the digit-serial multiplicand at input connections 9-1, . . . 9-N, respectively, along their left boundaries. The braid cells 8-1, . . . 8-N receive carry bits from multiplicand-bit-slice modules processing more significant bits of the multiplicand, on selected ones of the input connections 10-1, . . . 10-N along their left boundaries. The braid cells 8-1, . . . 8-N receive sum bits from multiplicand-bit-slice modules processing more significant bits of the multiplicand, on selected ones of the input connections 11-1, . . . 11-N along their left boundaries.

The bottommost tile in the multiplicand-bit-slice module of FIGS. 6A and 6B is a control cell 12 shown in FIG. 6B. Control cell 12 contains among other circuitry, circuitry for applying one of the bits B(W-K) of the multiplicand to the B column bits of the multiplicand-bit-slice module. The leftmost multiplicand-bit-slice module, which processes the most significant bit of the multiplicand, (e.g., module 101 of the FIG. 5 16×16 multiplier) receives the digit-serial multiplicand at its input connections 9-1, . . . 9-N. Each digit is applied to those input connections 9-1, . . . 9-N in order of increasing significance. The bits of each successive digit are latched in respective latches 13 in the control cells 12 of the N leftmost multiplicand-bit-slice modules during respective successive ones of a first series of clock intervals during which the multiplicand is loaded into the digital multiplier. The braid cells 8-1, . . . 8-N permute the order of the bits of the multiplicand digit with the rightward passage of these bits through each multiplicand-bit-slice module, so the latched bits of the multiplicand digit are applied to the input connections 9-1, ... 9-N of the $(N+1)^{th}$ from left multiplicand-bit-slice module in order of increasing significance. This basic shifting operation is repeated during each clock interval in the first series to move the digits of data rightward until the complete multiplicand except for the last digit is stored in latches 13 of all the multiplicand-bit-serial modules except the N rightmost ones. Then, during the last clock interval in the first series a MULTIPLICAND LOAD signal applied via a LOAD bus crossing the control cells 12 horizontally near their bottom boundaries causes a multiplexer 14 in each control cell 12 to apply a respective one of the bits of the full multiplicand to a latch 15.

During a second series of clock intervals immediately following the first series, the multiplexers 14 receive no MULTIPLICAND LOAD signal. Each multiplexer 14 is conditioned to select to the input port of the succeeding latch 15 signal from its own output port. So the multiplicand bit in the latch 15 continues to be maintained at latch 15 output port throughout the second series of clock intervals, and this bit is applied to the B column bus from the output port of latch 15. During this second series of clock intervals the digit-serial multiplier is supplied one digit at a time to the row busses $A_0, \ldots A_N$.

The function of the control cells 12 in placing the bits of the multiplicand on the B column busses has been explained. Consideration will now be given to the function of the control cells 12 in providing for the scrolling of the multiplier-bit-slice cell array. During every clock interval except the last clock interval of this second series, a control or CONT bus crossing the control cells 12 horizontally near their top boundaries has a ZERO applied thereto. During the last clock interval in the second series a ONE is applied to the CONT bus.

A respective exclusive-OR or XOR gate 16 in each control cell 12 responds to the ZERO on the CONT bus being applied to one of its input ports to drive the BI bus connected from its output port in non-inverting response to the single-bit digital signal applied to the other of its input ports from the BI bus. So, the $N^{th}$ multiplier-bit-slice cell 3-N in FIG. 6A generates a single-bit product of B(W-K) times $A_{XN-1}$ where X is a positive integer at least unity and less than (W/N). During the last clock interval in the second series of the ONE on the CONT bus causes XOR gate 16 to apply to BI bus the complement of the bit on the B bus. The $N^{th}$ multiplier-bit-slice cell 3-N generates a single-bit product of B(W-K) times $A_{(W-1)}$ to implement subtraction of the partial product of $A_{(W-1)}$ times the multiplicand.

FIG. 6B shows a logic inverter 17 responding to the signal on the CONT bus to supply its one's complement to a $\overline{CONT}$ bus internal to the control cell 12. The ONE on the $\overline{CONT}$ bus during each clock interval except the last in the second series is applied to one input port of a respective two-input AND gate 18 in each control cell 12. This causes the output signal of the AND gate 18 applied to the input port of a clocked latch (or unit delay) 19 to follow the carry signal supplied to the other input port of the AND gate 18 from the multiplier-bit-slice cell 3-N of the same multiplicand-bit-slice module via its carry output or, CO, bus. Latch 19 output port drives a CT bus which runs vertically up the right side of the multiplicand-bit-slice module to its multiplier cap cell 4, bends left in the multiplier cap cell 4 and then bends downward in multiplier cap cell 4 to deliver the delayed-by-one-clock-interval carry bit from multiplier-bit-slice cell 3-N to the multiplier-bit-slice cell 3-1 adder 6-1.

The ONE on the $\overline{CONT}$ bus is also applied to the input port of a respective two-input AND gate 20 in each control cell 12. This causes the output signal of the AND gate 20 applied to the input port of a clocked latch (a unit delay) 21 to follow the sum signal supplied from the multiplier-bit-slice cell 3-N of the same multiplicand-bit-slice module via its sum output, or SO, bus. Latch 21 output port drives an ST bus which runs vertically up the right side of the multiplicand-bit-slice module to its multiplier cap cell, there to bend left and down to be directed into multiplier-bit-slice cell 3-1. In cell 3-1 a connection is made to the SI sum input bus of the multiplier-bit-slice cell to the right of cell 3-1—that is, to the first row multiplier-bit-slice cell of the multiplicand-bit-slice module to the right of that shown in FIGS. 6A and 6B.

The ZERO appearing in the $\overline{CONT}$ bus during the last clock interval of the second series causes all AND gates 18 and 20 in the multiplicand-bit-slice modules to forward ZEROs to their latches 19 and 21. Accordingly, the top row of multiplier-bit-slice cells receive no left-over carry or sum ONEs in the next multiplication.

The function of the control cells in providing for the scrolling of the multiplier-bit-slice cell array has been explained. Consideration will now be given to the function of the control cells 12 in providing shift registers for shifting rightward to the final digit-serial adder the carry and sum terms that determine the major product. These shifts take place during a third series of clock intervals immediately following the second series of clock intervals.

During the last clock interval of the second series a ONE appears on the CONT bus. A multiplexer 22 in each control cell 12 responds to this condition to load into a respective latch 23 the carry bit received via a downward-extended CO bus. A multiplexer 24 in each control cell 12 responds to this condition to load the sum bit received via a downward extended SO bus either into a latch 25 of the control cell 12 of the $N^{th}$ next multiplicand-bit-slice module to the right—or, in the case of the final multiplicand bit-slice modules into a portion of the final adder used to accumulate the major product.

During the third series of clock intervals the CONT bus is at ZERO level. The multiplexers 22 respond to this condition to complete the connections of latches 22 via braid cells 8-1, ... 8-N to form a first parallel-in/digit-serial-out shift register for the carry bits. The multiplexers 24 respond to this condition to complete the connections of latches 25 via braid cells 8-1, 8-N to form a second parallel-in/digit-serial-out shift register for the sum bits.

Figure 7:
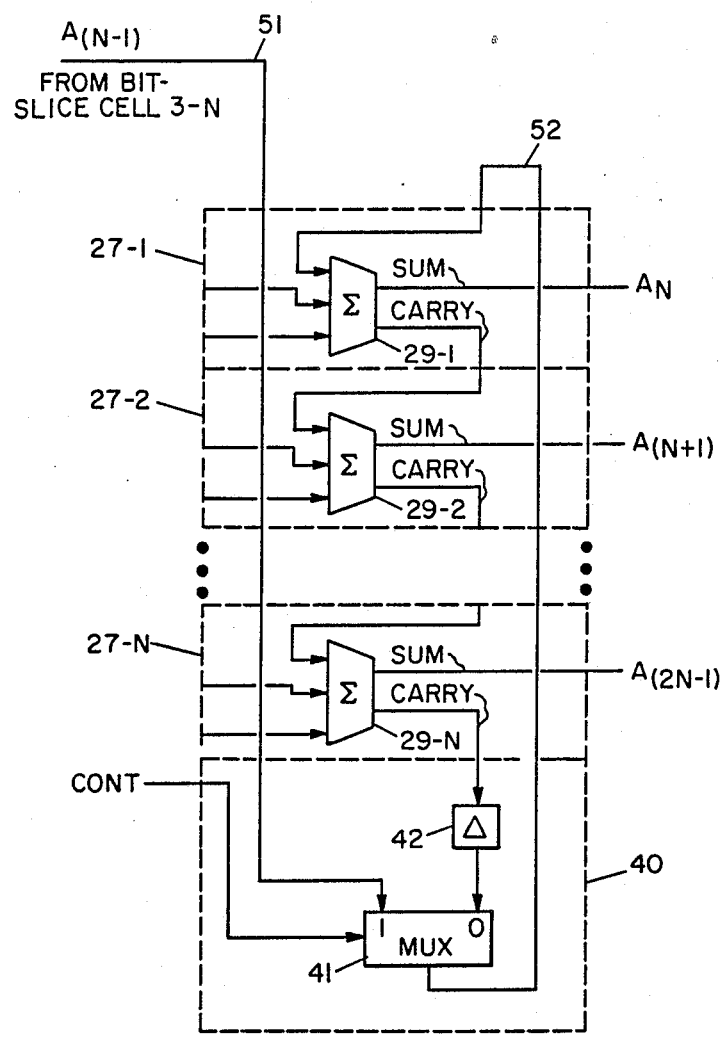
FIG. 7 is a schematic diagram of the final adder of the FIG. 5 digit-serial multiplier.

FIG. 7 shows the important tiles in the multiplier output module: a number N of final adder cells 27-1 through 27-N and a final adder control cell 40 atop which the final adder cells are stacked.

The final adder cells 27-1 through 27-N include adders 29-1 through 29-N respectively. The carry bits in the output signals of the adders 29-1, ... 29-(N-1) are applied as addends to the adders 29-2, ... 29-N respectively. The adders 29-1, ... 29-N receive the sum and carry bits from the braid cells 8-1, ... 8-N respectively in the most rightward multiplicand-bit-slice module.

The sum bits of adders 29-1 through 29-N supply respective bits increasing in significance that form the major product in digit-serial format. The major product is generated during the third series of clock intervals immediately following the second series of clock intervals when the digit-serial multiplier signal enters the digital multiplier apparatus and when the minor product is generated.

The final adder control cell 40 has a multiplexer 41 thereon controlled by signal on the CONT bus which crosses the left side of cell 40 from the right side of the control cell 12 shown in FIG. 6B. Except for the last digit of the digit-serial multiplexer signal the CONT bus supplies a ZERO to multiplexer 41 as control signal. Responsive to this ZERO the multiplexer 41 selects to the input connection of a clocked latch 42 the carry bit from adder 29-N, as delayed by a clocked latch 42 until the next digit of the digit-serial multiplier signal and supplies the delayed carry bit to the carry input connection of adder 29-1. This delayed carry bit is supplied via a bus crossing the ends of final adder cells 29-1 through 29-N from which bus a jumper connection 52 is made to adder cell 27-1 and the carry input connection of its adder 29-1.

During the last digit of the digit-serial multiplier signal the CONT bus supplies a ONE when signed multiplication using two's complement multiplier and multiplicand is employed. Responsive to this ONE multiplexer 41 applies the sign bit of the multiplier signal from the $A_{(N-1)}$ bus, as received via a jumper connection 51 and a further bus which crosses the left ends of the final adder cells 27-1 through 27-N, and applies this sign bit to the carry input connection of adder 29-1 via the bus crossing the right ends of the final adder cells 27-1 through 27-N. This completes the subtraction of the partial product of $A_{(N-1)}$ times the multiplicand, begun earlier with the complementing of the multiplicand bits prior to multiplying them by $A_{(N-1)}$.

Figure 8:
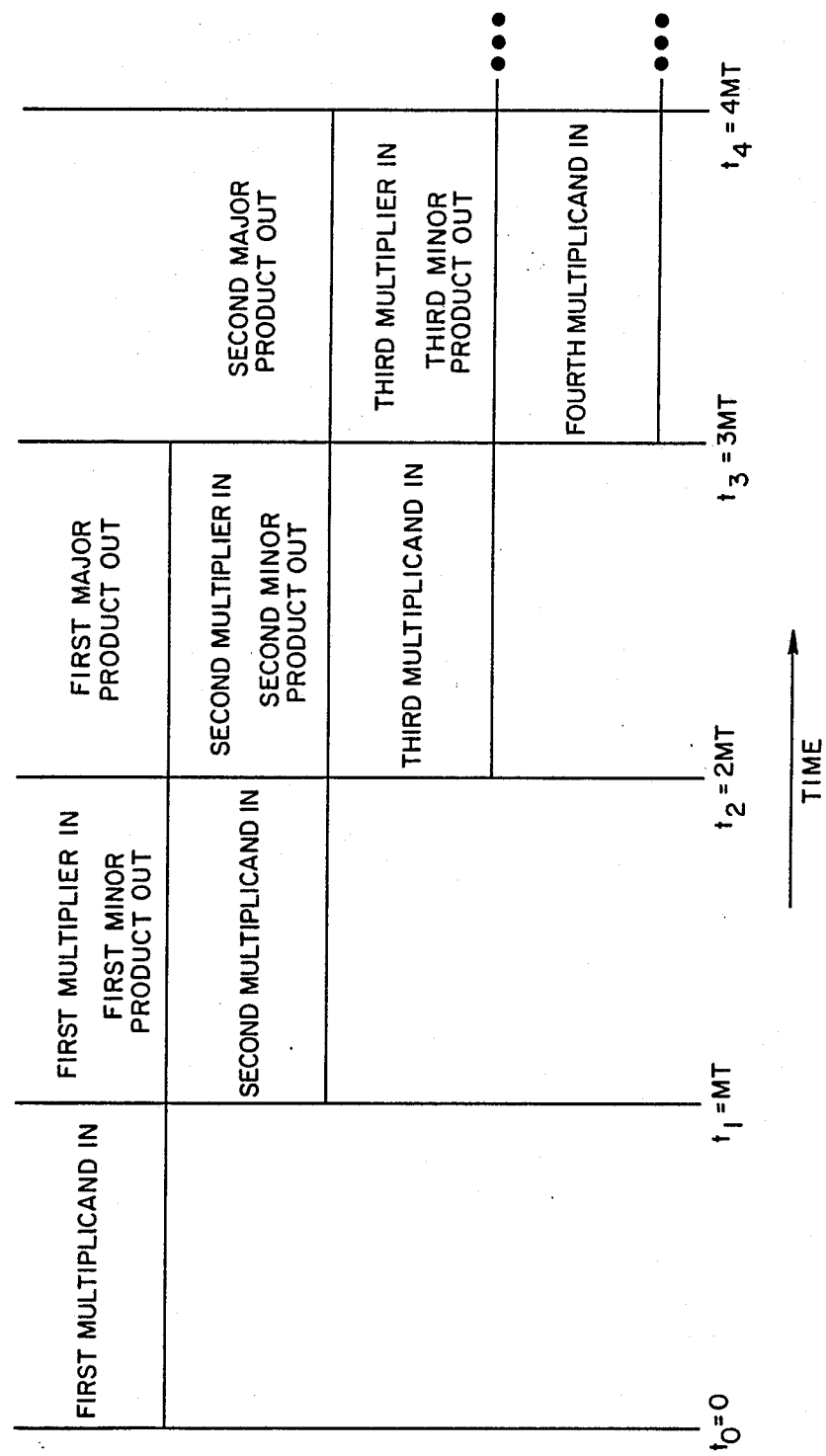
FIG. 8 is a timing diagram useful in understanding how a succession of multiplications may be done on a pipelined basis with the digit-serial multiplier of the invention.

FIG. 8 illustrates how pipelined multiplications involving W-bit multiplicands and W-bit multipliers can be done with the digit-serial multiplier described above. In such operation the LOAD and CONT busses may be paralleled to receive ONE simultaneously every $M^{th}$ clock interval, where $M=W/N$ and is the number of digits per word. The first series of M clock intervals for a first of the successive multiplications extends from time $t_0$ to time $t_1$. During this period the multiplicand for the first multiplication enters the digit-serial digit multiplier. If T is the length of each clock interval $t_1 = MT$.

The second series of M clock intervals for this first multiplication is coincident with the first series of M clock intervals for a second of the successive multiplications and extends from time $t_1 = MT$ to time $t_2 = 2MT$. The multiplier for the first multiplication and the multiplicand for the second multiplication enter the digit-serial digital multiplier in parallel between times $t_1$ and $t_2$; and the digit-serial minor product for the first multiplication exits the digit-serial digital multiplier.

The third series of M clock intervals for the first multiplication, extending from time $t_2$ to time $t_3$, is coincident with the second series of clock intervals for the second multiplication and with the first series of clock intervals for a third multiplication. The digit-serial major product of the first multiplication and the digit-serial minor product of the second multiplication exit the digital multiplier while the digit-serial multiplier of the second multiplication and the digit-serial multiplicand of the third multiplication enter the multiplier.

With the first multiplication completed, a fourth multiplication is started during the next series of M clock intervals, in the period between times $t_3$ and $t_4$, as the second and third multiplications progress. The multiplicand for the fourth multiplication enters the digital multiplier in parallel with the multiplier for the third multiplication. Also in the period between times $t_3$ and $t_4$, the major product for the second multiplication and the minor product for the third multiplication exit the digital multiplier.

The ongoing nature of the calculation cycle from the time $t_4$ onward should at this point in the description be apparent to the reader. Where the multiplications are not "square"—that is, where the multiplier has more digits than the multiplicand—variations of the FIG. 8 scheme of operation are possible, wherein the shorter first series of clock intervals for one multiplication overlaps the finishing portion of a longer second series of clock intervals for the preceding multiplication, and wherein the shorter third series of clock intervals for one multiplication overlaps the beginning portion of a longer second series of clock intervals for the succeeding multiplication. If the multiplicand does not change in a succession of multiplications the LOAD bus can be maintained at ZERO throughout second series of clock intervals for the later multiplications rather than being pulsed to ONE on the last clock interval of those second series. One skilled in the art and aquainted with the foregoing specification will be enabled to design variants of the described digit-serial multiplier that are within the spirit of the invention, and the scope of the claims that follow should be construed to include such variants.

Figure 9:
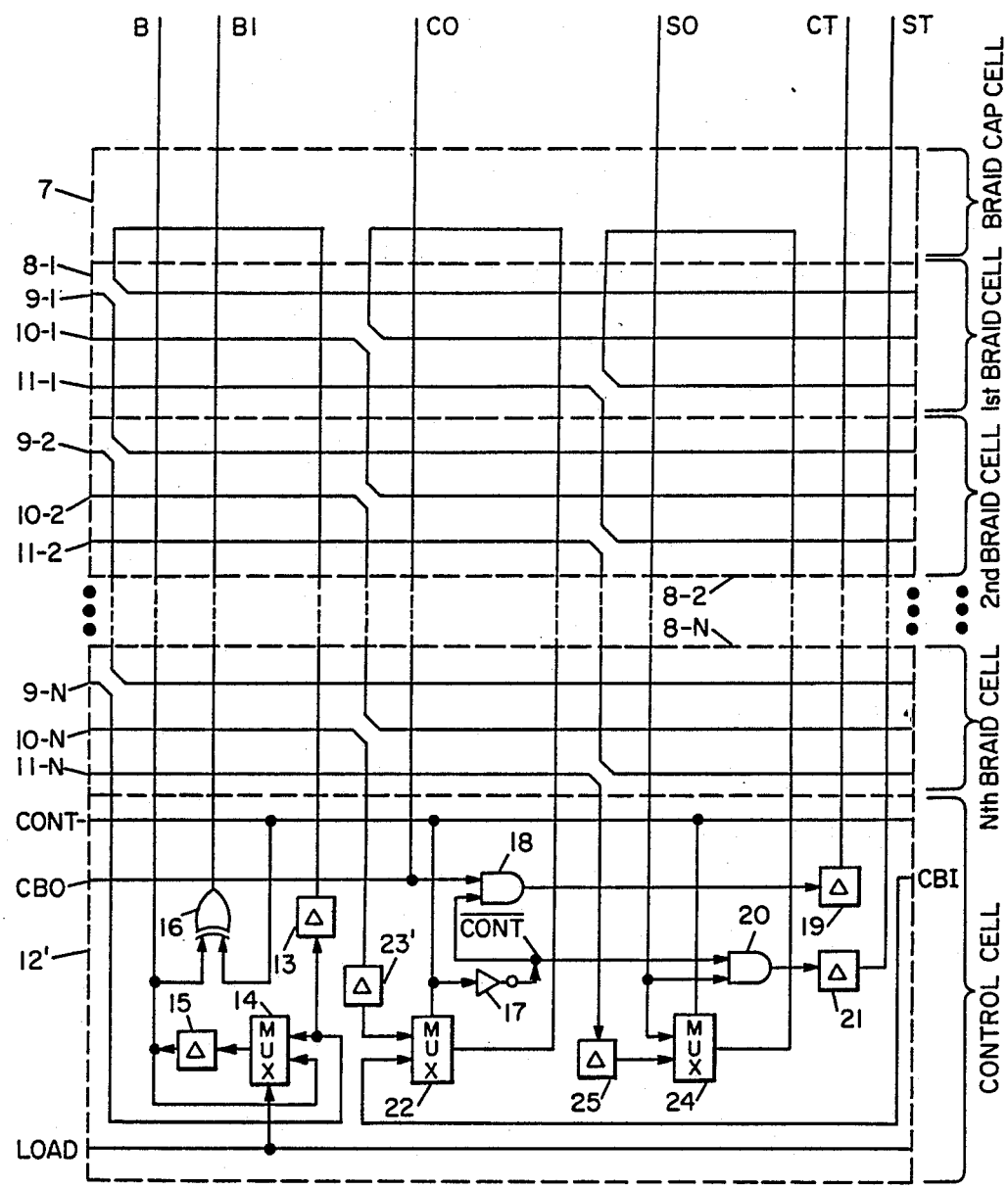
FIG. 9 is a schematic diagram of a portion of one bit slice of the FIG. 5 digit-serial multiplier, advantageously used in place of that portion of one bit slice of the FIG. 5 digit-serial multiplier shown in FIG. 6A.

FIG. 9 shows a variant of that portion of the bit-slice cell shown in FIG. 6B, which variant modifies the CONTROL cell 12. One modification included in the CONTROL cell 12' of FIG. 9 is that the carry out CO signal applied to AND gate 18 is not applied to multiplexer 22' in that CONTROL cell 12', but rather is fed to a carry back output connection CBO at the left side of the cell for connecting to a carry back input connection CBI at the right side of the CONTROL cell 12' to its left (if such there be). Rather than receiving CO carryout signal as an input signal thereof, multiplexer 22' in the CONTROL cell 12' receives a signal applied to its carry back input connection CBI either from the carry back output connection of another CONTROL cell 12' immediately to its right or (in the case of the rightmost CONTROL cell 12') from the $A_{(N-1)}$ output of bit slice cell 3-N. Clocked delay latch 23 is replaced by direct connection, and instead a clocked delay latch 23' is introduced into the input connection to multiplexer 22 not receiving the carry back input CBI signal.

Figure 10:
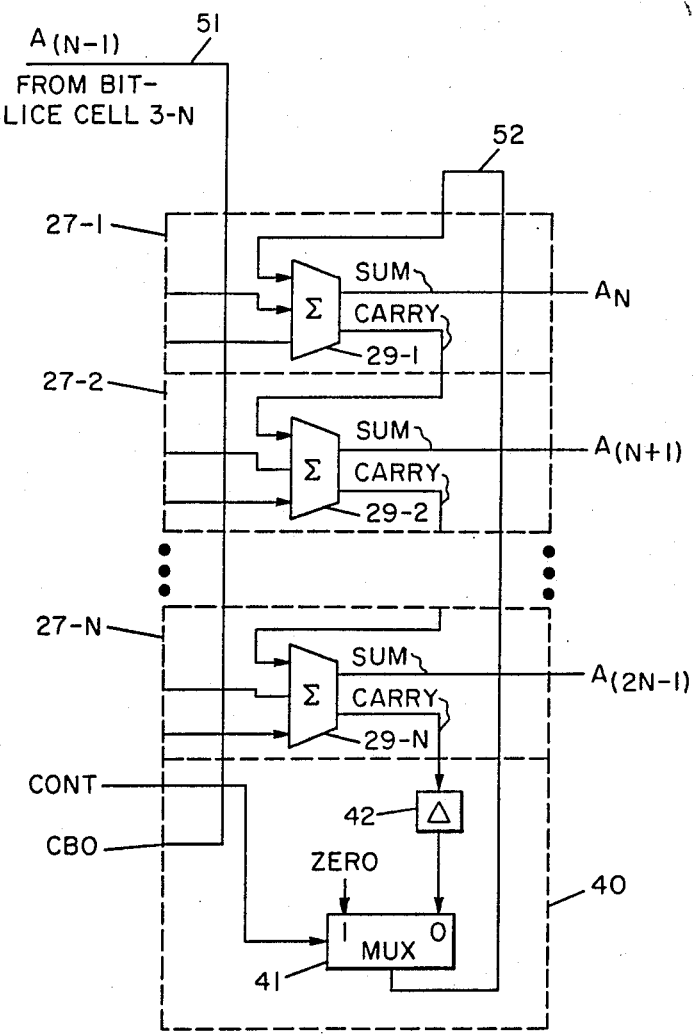
FIG. 10 is a schematic diagram of the final adder of the FIG. 5 digit-serial multiplier when each bit slice thereof is as shown in FIGS. 6B and 9.

FIG. 10 shows a modification of the FIG. 7 final adder in respect to final adder control cell 40' that accommodates the modified CONTROL cell 12'. Final adder control cell 40 has a carry back output connection CBO for applying $A_{(N-1)}$ from bit slice 3-n to the carry back input connection of the rightmost CONTROL cell 12'.

Multiplexer 41' has an arithmetic ZERO rather than $A_{(N-1)}$ applied to its input connection selected by ONE control signal. The control signal applied to multiplexer 41 is delayed one digit by clocked delay latch 43 from the control signal appearing on CONT control line.

These changes add $A_{(N-1)}$ into the least significant carry position instead of including it in the final addition generating the major product. Another variation that is possible delays the production of the major product, so that logic flow through the array of adders in the rightmost bit slice, then through multiplexers 22 and 24, and finally through the final adder need not take place all in one clock cycle. In this other variation, modified control cell 12' of FIG. 9 is further modified, with clocked delay latches 23' and 25 being replaced by direct connections, and with clocked delay latches 23 and 25' being inserted after multiplexers 22 and 24 respectively. The modified final adder control cell 40' of FIG. 10 is further modified by introducing a clocked delay latch 43 between the control line CONT and its connection to multiplexer 41.

What is claimed is:

1. A digital multiplier for multiplying together two digit-serial operands, one a multiplicand W bits in length and the other a multiplier, each digit in said operands being n bits in length, n being a plural integer that is a submultiple of W, said digital multiplier comprising:
   an array of multiplier cells arranged in n rows and W columns;
   a respective row bus associated with each row of cells in a manner particularly set forth hereinafter in this claim, said row busses being identified by consecutive ordinal numbers first through $n^{th}$;
   a respective column bus associated with each column of cells in a manner particularly set forth hereinafter in this claim, said column busses being identified by consecutive ordinal numbers first through $W^{th}$;
   a respective single-bit by single-bit digital multiplying circuit included in each said multiplier cell for multiplying together the bits on the row bus and the column bus associated with that multiplier cell to generate a respective single-bit product, said multiplying together of bits on said row bus and said column bus by each said digital multiplying circuit establishing the association of those two busses with said multiplier cell in which that said digital multiplying circuit is included;
   a respective adder included in each of said multiplier cells, having a respective first input port connected to said digital multiplying circuit included in the same multiplier cell to receive its respective single-bit product, having a respective second input port, and having respective first and second output ports for supplying a carry bit portion and a sum bit portion respectively of the two-bit full sum of the addends received at its input ports, each said adder included in any said multiplier cell located in a column other than said first column having a respective third input port;
   a respective connection of the first output port of each said adder in any said multiplier cell in any said row other than the $n^{th}$ row to the second input port of the adder included in the multiplier cell located in the succeeding row and in the same column; and
   a respective connection of the second output port of each said adder in any said multiplier cell in any said row other than said $n^{th}$ row and in any said column other than said $W^{th}$ column to the third input port of the adder included in the multiplier cell located in the succeeding row and the succeeding column, said digital multiplier being arranged for digit-serial operation and further comprising:
   a digit-serial-in/parallel-out register, receptive of said digit-serial multiplicand a digit at a time during each of a first series of clock intervals for storing all the bits of said multiplicand and applying them in order of decreasing significance to the first through $W^{th}$ column busses respectively;
   means for applying, during each of a second series of clock intervals, following said first series of clock intervals, the bits of a successive digit of said digit-serial multiplier in order of increasing significance to the first through $n^{th}$ row busses respectively;
   means for respectively applying, during each clock interval in said second series except the first, the carry appearing the previous clock interval at the first output ports of the adders in the $n^{th}$ row of multiplier cells to the second input ports of adders in the first row of multiplier cells and in corresponding columns of the array of multiplier cells;
   means for respectively applying during each clock interval in said second series after the first, the sum bits appearing in the previous clock interval at the second output ports of the adders in the entire $n^{th}$ row of multiplier cells, except the adder in the $W^{th}$ column, to the third input ports of adders in the first row of multiplier cells and in columns of the array of multiplier cells with next higher ordinal number;
   means for applying zeroes to the second and third input ports of the adders in said first row of multiplier cells during said first series of clock intervals, and during the first clock interval in said second series of clock intervals;
   means for providing a minor product output signal in digit-serial form from the second output ports of the adders in the $W^{th}$ column of multiplier cells; and
   means for providing a major product output signal in digit-serial form; which means includes:
   a first parallel-in/digit-serial-out register having W successive stages loaded in parallel with carry bits from the first output ports of adders in successive columns of said $n^{th}$ row of multiplier cells during the last of said second series of clock intervals;
   means for shifting the contents of said first parallel-in/digit-serial-out register one stage towards an output port thereof during each succeeding clock interval of a third series of clock intervals following said second series of clock intervals;
   a second parallel-in/digit-serial-out register having n successive stages loaded in parallel with sum bits from the second output ports of adders in successive columns of said $n^{th}$ row of multiplier cells during the last of said second series of clock intervals;
   means for shifting the contents of said second parallel-in/digit-serial-out register one stage towards an output port thereof during each succeeding clock interval of said third series of clock intervals;
   means for delaying the shifted carry portions one clock interval respective to the shifted sum portions; and
   a digit-serial adder for adding the delayed shifted carry bits to the shifted sum bits to generate said major product output signal in digit-serial form.

2. A digit-serial multiplier as set forth in claim 1 included in an arrangement for performing successive multiplications, wherein the first series of clock intervals for each multiplication except the initial one overlaps at least the finishing portion of the second series of clock intervals for the preceding multiplication.

3. A digit-serial multiplier as set forth in claim 2 wherein the third series of clock intervals for each multiplication except the final one overlaps at least the beginning portion of the second series of clock intervals for the succeeding multiplication.

4. A digit-serial multiplier as set forth in claim 1 included in an arrangement for doing successive multiplications, wherein the first series of clock intervals for each multiplication except the initial one overlaps at least the finishing portion of the second series of clock intervals for the preceding multiplication, and wherein the third series of clock intervals for each multiplication except the final one overlaps at least the beginning portion of the second series of clock intervals for the succeeding multiplication.

5. A parallel-in digit-serial-out register for words of W bits supplied as m successive digits of n-bits each, m and n being positive plural integers, and W being the integer equal to m times n, said parallel-in digit serial-out register comprising:
  an n-bit-wide output port for delivering digit-serial output signals each digit of which has n bits therein;
  a respective pipeline for each bit of said digit-serial output signals preceding said output port, said pipelines identified by consecutive ordinal numbers first through $n^{th}$;
  a plurality W in number of input ports for receiving in parallel the bits of a digit-serial word, said input ports identified by consecutive ordinal numbers first through $W^{th}$ in order of the significance of the bit respectively applied thereto;
  a plurality $\underline{W}$ in number of multiplexers consecutively ordinally numbered zeroeth through $(W-1)^{th}$ having respective first input connections to the input port similarly ordinally numbered, having respective second input connections, and having respective output connections, each said multiplexer having between the second input connection and the output connection thereof a respective selective path which is included in the pipeline having the same ordinal number modulo n that that one of said multiplexers has, the multiplexers thus included in each pipeline being arranged in order of ordinal number between the beginning end and the output port end of that pipeline;
  a number W of latches, m latches of which are included in each pipelined with one of the m latches being included at one end of said pipeline and the other of the m latches respectively connecting the output connection of each said multiplexer included in that pipeline to the second input connection of the following said multiplexer included in that pipeline;
  means for clocking in parallel once a clock interval said latches in said number W thereof;
  means for controlling said multiplexers to discontinue the selective paths therewithin only during selected clock intervals separated by at least (m-1) intervening clock intervals, and to provide instead during said selected clock intervals selective paths from the first input connections of said multiplexers to their output connections respectively; and
  means for arranging said multiplexers to be in respective iterations of an iterative monolithic integrated-circuit structure, including
  a braiding of said pipelines from latch to latch.

6. A monolithic integrated circuit including a first and a second of said parallel-in/digit-serial-out registers as set forth in claim 5 in combination with:
  a digit-serial adder having a first input port to which the output port of said first parallel-in/digit-serial-out registers connects, having a second input port to which the output port of said second parallel-in/digit-serial-out register connects, and having an output port.

7. A combination as set forth in claim 6 wherein each of the pipelines of said first parallel-in/digit-serial-out register has said one of the m latches therein at its beginning end and wherein each of the pipelines of said second parallel-in/digit-serial-out register has said one of the m latches therein at its output port end.

8. A combination as set forth in claim 7 on the same monolithic integrated circuit with a W-column-by-n-row array of multiplier cells, each of the multiplier cells in the last row of the array providing sum bits to the first through $W^{th}$ input ports of said first parallel-in/digit-serial-out register and providing carry bits to the first through $W^{th}$ input ports of said second parallel-in/digit-serial-out register.

9. A digit multiplier for multiplying together two digit-serial operands, one a multiplicand W bits in length and the other a multiplier mn bits in length, each digit in said operands being n bits in length, m being a positive integer and n being a positive plural integer that is a submultiple of W, said digital multiplier comprising:
  a plurality n times W in number of multiplying circuits each having respective first and second single-bit-wide input ports and having a respective single-bit-wide output port, said plurality of multiplying circuits being grouped into n groups respectively identified by consecutive ordinal row numbers first through $n^{th}$, each of which groups consists of a respective number W of multiplying circuits respectively identified by consecutive ordinal column numbers first through $W^{th}$, whereby a respective one of said multiplying circuits is uniquely identified by each pair of row and column numbers;
  a plurality, n in number, of row busses respectively identified by consecutive ordinal row numbers first through $n^{th}$, each row bus connecting to the first input ports of those of said multiplying circuits in the one of said n groups identified by the same ordinal row number as that row bus;
  a plurality, W in number, of column busses respectively identified by consecutive ordinal column numbers first through $W^{th}$, each column bus connecting to the second input ports of those of said multiplying circuits identified by the same ordinal column number as that column bus;
  a plurality, n times W in number, of adders being grouped into n groups, respectively identified by consecutive ordinal row numbers first through $n^{th}$, each of which groups consists of a respective number W of adders respectively identified by consecutive ordinal column numbers first through $W^{th}$, whereby a respective one of said adders is uniquely identified by each pair of row and column numbers, each said adder having a respective first input port to which connects the output port of said multiplying circuit identified by the same pair of row and column numbers, each said adder having a respective second input port, each said adder except each identified by first column number having a respective third input port, each said adder having first and second output ports for supplying a carry bit portion and a sum bit portion respectively of a two-bit full sum of bits received at its input ports, the first output port of each said adder identified by a row number other than $n^{th}$ connecting to the second input port of said adder identified by the same column number and a row number one higher, the second output port of each said adder identified both by a row number other than $n^{th}$ and by a column number other than $W^{th}$ connecting to the third input of said adder identified by the next higher row and column numbers;

means for providing a minor product output signal in digit-serial form from the second output ports of said adders identified by $W^{th}$ column number; and means for providing a major product output signal in digit-serial form; which means includes:

a first parallel-in/digit-serial-out register having W successive stages loaded in parallel during the last of said second series of clock intervals with carry bits from the first output ports of said adders identified by said $n^{th}$ row number and by each of said column numbers;

means for shifting the contents of said first parallel-in/digit-serial-out register one stage towards an output port thereof during each succeeding clock interval of a third series of clock intervals following said second series of clock intervals;

a second parallel-in/digit-serial-out register having n successive stages loaded in parallel during the last of said second series of clock intervals with sum bits from the second output ports of said adders identified by said $n^{th}$ row number and by each of said column numbers;

means for shifting the contents of said second parallel-in/digit-serial-out register one stage towards an output port thereof during each succeeding clock interval of said third series of clock intervals;

means for delaying the shifted carry portions one clock interval respective to the shifted sum portions; and a digit-serial adder for adding the delayed shifted carry bits to the shifted sum bits to generate said major product output signal in digit-serial form.

10. A digit-serial multiplier as set forth in claim 9 included in an arrangement for performing successive multiplications, wherein the first series of clock intervals for each multiplication except the initial one overlaps at least the finishing portion of the second series of clock intervals for the preceding multiplication.

11. A digit-serial multiplier as set forth in claim 10 wherein the third series of clock intervals for each multiplication except the final one overlaps at least the beginning portion of the second series of clock intervals for the succeeding multiplication.

12. A digit-serial multiplier as set forth in claim 9 included in an arrangement for doing successive multiplications, wherein the first series of clock intervals for each multiplication except the initial one overlaps at least the finishing portion of the second series of clock intervals for the preceding multiplication, and wherein the third series of clock intervals for each multiplication except the final one overlaps at least the beginning portion of the second series of clock intervals for the succeeding multiplication.

13. A digit-serial multiplier as set forth in claim 9 wherein each said multiplying circuit is a respective AND gate.

14. A method of performing digit-serial multiplication of a multiplicand signal by a multiplier signal, by iteratively using a combinational array multiplier composed of (1) a plurality of multiplier cells connected in an n successive row by W successive columns array, for generating a minor product n bits at a time from the column of said array receiving the least significant bit of said multiplicand signal, and for generating W uncombined sum bits and W uncombined carry bits of different weights defining a major product which are supplied from the row of said array receiving the most significant bit of said multiplier signal, each multiplier cell including a respective digital multiplier and subsequent adder, and (2) means for generating a major product by combining the uncombined sum and carry bits of different weights defining it, as supplied from the row of said array receiving the most significant bit of said multiplier signal, n being a plural positive integer and W being a positive multiple thereof, said method comprising the steps of:

applying the W bits of a multiplicand signal in parallel to respective ones of said columns of multiplier cells in said combinational array multiplier, thereby to supply multiplicand bits to the digital multipliers in said multiplier cells;

applying the mn bits of a multiplier signal, in m successive digits of n bits applied in parallel to respective ones of said rows of multiplier cells in said combinational multiplier, thereby to supply multiplier bits to the digital multipliers in said multiplier cells, m being a positive plural integer;

applying during the first (m-1) digits of said multiplier signal the uncombined bits of said major product with appropriate bit place shifts as carries to said adders in the row of said array receiving the least significant bit of said multiplier signal, thereby continuing multiplication to extend said minor product to m digits of n bits width; and after the $m^{th}$ digit of said multiplier signal, generating said major product by combining the uncombined sum and carry bits of different weights defining it, as supplied from the row of said array receiving the most significant bit of said multiplier signal.

* * * * *